United States Patent
Tsuda

(10) Patent No.: US 7,539,468 B2
(45) Date of Patent: May 26, 2009

(54) COMMUNICATION TERMINAL DEVICE AND AMPLIFICATION CIRCUIT

(75) Inventor: Shinichiro Tsuda, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 0 days.

(21) Appl. No.: 10/513,252

(22) PCT Filed: Mar. 3, 2004

(86) PCT No.: PCT/JP2004/002652

§ 371 (c)(1),
(2), (4) Date: Jun. 28, 2005

(87) PCT Pub. No.: WO2004/079899

PCT Pub. Date: Sep. 16, 2004

(65) Prior Publication Data

US 2006/0057981 A1    Mar. 16, 2006

(30) Foreign Application Priority Data

Mar. 7, 2003    (JP) ............................ 2003-062297

(51) Int. Cl.
*H01Q 11/12*    (2006.01)
*H04B 1/04*    (2006.01)

(52) U.S. Cl. .............. 455/127.3; 455/127.1; 455/127.2; 330/254; 330/285; 330/133

(58) Field of Classification Search .............. 455/127.2, 455/522; 330/133, 254, 285
See application file for complete search history.

(56) References Cited

U.S. PATENT DOCUMENTS 5,548,616 A    8/1996    Mucke et al.

(Continued)

FOREIGN PATENT DOCUMENTS

JP    04-003625    1/1992

(Continued)

*Primary Examiner*—Duc Nguyen
*Assistant Examiner*—Zhiyu Lu
(74) *Attorney, Agent, or Firm*—Oblon, Spivak, McClelland, Maier & Neustadt, P.C.

(57) ABSTRACT

Power consumed by a power-variable amplifying unit for amplifying and supplying data to an antenna in a mobile telephone carrying out data transmission by changing transmission power in accordance with a TPC bit transmitted from a base transceiver station is reduced.

The power-variable amplifying unit is constituted with a variable gain amplifier (21) in which a gain is variably controlled with a control voltage corresponding to the above-described TPC bit, a driver amplifier (22) with a fixed gain, and a power amplifier (23) with a fixed gain. Then, a variable resistance 25 for bypassing a current flowing through a transistor (26) of the driver amplifier (22) is provided, and a resistance value of this variable resistance (25) is variably controlled with the control voltage corresponding to the above-described TPC bit. Accordingly, a current quantity of the current flowing through the transistor 26 can be controlled to be a current quantity according to the control voltage (=transmission power). Consequently, reduction in power consumption by the driver amplifier (22) results in reduction in the power consumed by the aforementioned power-variable amplifying unit.

18 Claims, 5 Drawing Sheets

U.S. PATENT DOCUMENTS

| | | | | |
|---|---|---|---|---|
| 5,668,501 A | * | 9/1997 | Venes | 330/254 |
| 5,808,516 A | * | 9/1998 | Barber | 330/282 |
| 5,826,177 A | * | 10/1998 | Uno | 455/126 |
| 6,272,336 B1 | * | 8/2001 | Appel et al. | 455/423 |
| 6,323,732 B1 | * | 11/2001 | Angell et al. | 330/261 |
| 6,452,454 B1 | * | 9/2002 | Shapiro et al. | 330/289 |
| 6,566,951 B1 | * | 5/2003 | Merrigan et al. | 330/254 |
| 6,633,750 B1 | * | 10/2003 | Dacus et al. | 455/126 |
| 6,711,391 B1 | * | 3/2004 | Walker et al. | 455/234.1 |
| 6,721,368 B1 | * | 4/2004 | Younis et al. | 375/295 |
| 2003/0090324 A1 | * | 5/2003 | Tsukuda | 330/264 |

FOREIGN PATENT DOCUMENTS

| | | |
|---|---|---|
| JP | 06-021732 | 1/1994 |
| JP | 9-018358 | 1/1997 |
| JP | 10-093450 | 4/1998 |
| JP | 10-276047 | 10/1998 |
| JP | 11-8560 | 1/1999 |
| JP | 11-251934 | 9/1999 |
| JP | 2001-156564 | 6/2001 |
| WO | WO 99/43083 | 8/1999 |
| WO | WO 01/67621 A2 | 9/2001 |

\* cited by examiner

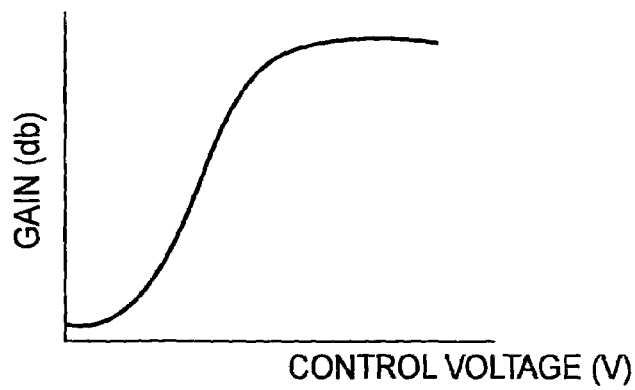
FIG. 4A
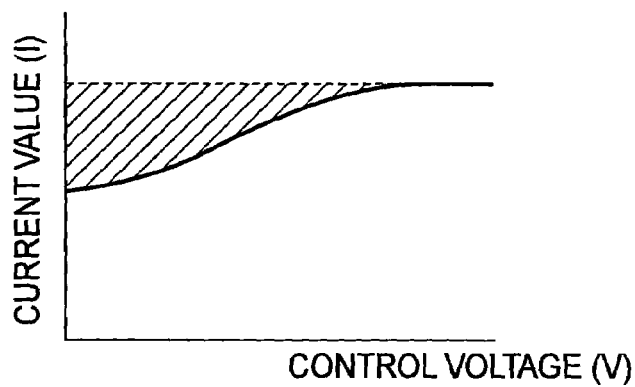
FIG. 4B
FIG.5
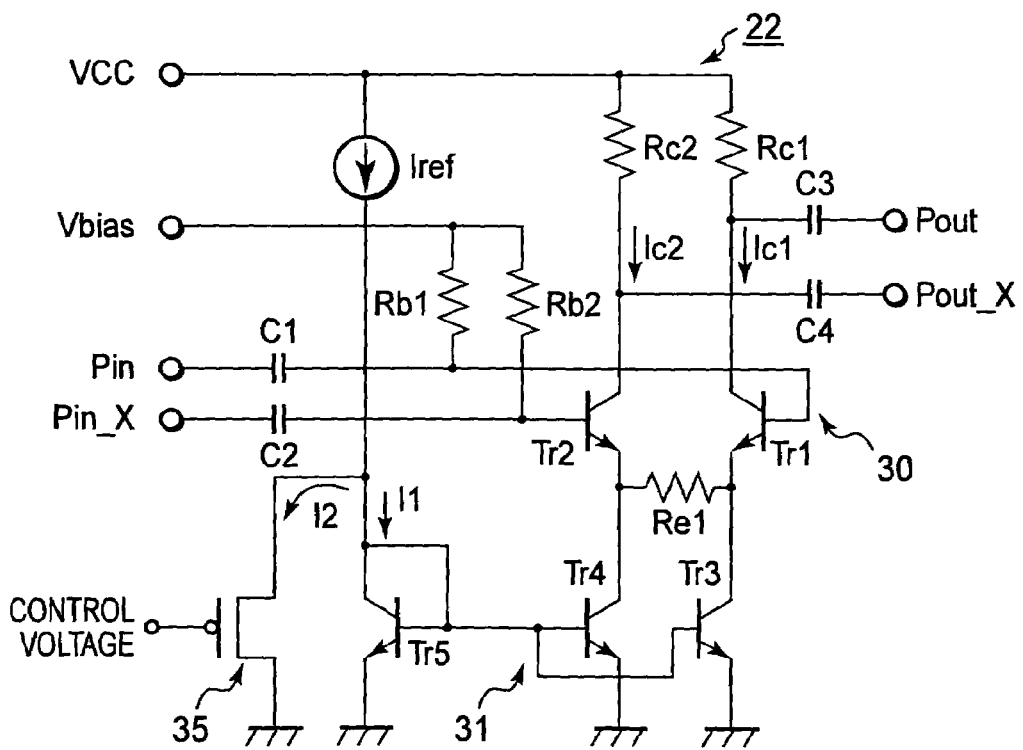

COMMUNICATION TERMINAL DEVICE AND AMPLIFICATION CIRCUIT

TECHNICAL FIELD

The present invention relates to a communication terminal apparatus and an amplifying circuit, both being suitably provided in a mobile telephone of, for example, the W-CDMA system, the CDMA system supporting the IS-95 standard, or the like, a telephone of PHS (personal Handyphone System), a PDA (personal digital (data) assistant) equipped with a wireless communication function, a personal computer apparatus, or the like.

BACKGROUND ART

In the W-CDMA system used as a communication system of a mobile communication terminal apparatus such as a mobile telephone today, all users use carriers having the same frequency.

However, when each mobile communication terminal apparatus transmits a signal to a base station at the same transmission level (transmission power) severally, a signal level from a mobile communication terminal apparatus nearer to the base station is larger than a signal level from a mobile communication terminal apparatus farther from the base station. Consequently, a problem of the difficulty of separating a signal transmitted from the mobile communication terminal apparatus farther from the base station by the base station occurs (distance problem).

Accordingly, a base station supporting the W-CDMA system performs communication by controlling the transmission level of each mobile communication terminal apparatus severally to the minimum necessary in accordance with the adaptive transmission power control based on measurement values of SIR (signal power to interference power ratios).

To put it concretely, the base station performs the despread processing of a signal received from each mobile communication terminal apparatus, and performs the RAKE synthesis of the signal. Then, the base station measures the above-described SIR measurement value. When the measured SIR measurement value is larger than a predetermined value (target value), the base station transmits a control command for lowering the transmission level to the mobile communication terminal apparatus. Moreover, in a case where the measured SIR measurement value is smaller than the above-described target value, the base station transmits a control command for raising the transmission level to the mobile communication terminal apparatus.

The mobile communication terminal apparatus adjusts its transmission level in accordance with the control command, and performs the transmission of a signal to the base station at the adjusted transmission level.

FIG. 7 shows a circuit diagram of a power-variable amplifying unit provided in a mobile communication terminal apparatus for performing such adaptive transmission power control.

As it is apparent from FIG. 7, the power-variable amplifying unit is an amplifying unit in three-stage configuration composed of a variable gain amplifier 101 capable of changing its gain, a fixed gain driver amplifier 102, and a fixed gain power amplifier 103, all connected in cascade.

A bias voltage (power supply voltage) is supplied to each of the amplifiers 101-103 from a power supply control unit, and each of the amplifiers 101-103 is in its driven state during a high level period of a signal for changing the transmission system to be in its driven state (active state) from the control unit (CPU) of the mobile communication terminal apparatus.

Moreover, the variable gain amplifier 101 is configured in order that the gain thereof may be variably controlled by a control voltage supplied from the CPU in accordance with the control command from the above-described base station.

When a transmit signal processed by spread modulation processing is supplied to the power-variable amplifying unit configured as above from a spread modulation processing unit through an input terminal 100, first the variable gain amplifier 101 amplifies the transmit signal by the gain in accordance with the control command from the above-described base station, and successively the driver amplifier 102 and the power amplifier 103, each having a fixed gain, severally amplify the transmit signal from the variable gain amplifier 101. Then, the transmit signal is transmitted to the above-described base station from an output terminal 104 through an antenna. Thereby, the above-described distance problem can be solved.

Incidentally, the following Japanese Patent Application Publication (KOKAI) No. Hei 9-116357 discloses a prior art document of such a gain amplifying circuit.

Patent Document: Japanese Patent Application Publication (KOKAI) No. Hei 9-116357 (see pp. 3-4, FIG. 1)

Here, FIG. 8A shows a characteristic diagram showing a relation between the control voltage and the gain of the above-described variable gain amplifier 101, and FIG. 8B shows a characteristic diagram showing a relation between the current value supplied to the above-described driver amplifier 102 and the control voltage of the above-described variable gain amplifier 101.

In FIG. 8A, the abscissa axis indicates the control voltage (V) supplied from the CPU to the variable gain amplifier 101, and the ordinate axis indicates the gain (db) of the variable gain amplifier 101 changed by the control voltage. As shown in FIG. 8A, the gain of the variable gain amplifier 101 gradually increases as the control voltage to be applied to the variable gain amplifier 101 is made to be larger.

On the other hand, in FIG. 8B, the abscissa axis indicates the above-described control voltage (V) to be supplied from the CPU to the variable-gain amplifier 101, and the ordinate axis indicates the current value (I) to be supplied to the driver amplifier 102.

The driver amplifier 102 is designed in order that the characteristics of the power-variable amplifying unit at the time of the maximum output of the aforementioned power-variable amplifying unit may satisfy an adjacent channel power leakage ratio as well as the above-described SIR (signal power to interference power ratio), and the driver amplifier 102 is configured to consume the same current quantity as that at the time of the maximum output even at the time of a low output, as shown in FIG. 8B. This means that the driver amplifier 102 has an excessive linear characteristic at the time of the low output.

Because the mobile communication terminal apparatus is used in a carried state, it is important to elongate the usable time (including a continuous talking time and a continuous waiting time).

However, as described above, because the driver amplifier 102 is configured to consume the same current quantity as that at the time of the maximum output despite at the time of a low output, the driver amplifier 102 consumes much waste power, and it is a primary factor of checking the elongation of the usable time of the mobile communication terminal apparatus.

The present invention was made in view of the above-mentioned problems, and aims to provide a communication terminal apparatus and an amplifying circuit, both capable of achieving the reduction of power consumption, and of elongating a usable time of the mobile communication terminal apparatus to which the present invention is applied.

DISCLOSURE OF THE INVENTION

A communication terminal apparatus according to the present invention includes: as means for solving the above-mentioned problem, receiving means for receiving transmission power control information for controlling transmission power of transmission information; amplifying means equipped with at least variable gain amplifying means for amplifying and outputting the above-described transmission information in accordance with the transmission power control information received by the above-described receiving means, and fixed gain amplifying means for amplifying and outputting the transmission information from the variable gain amplifying means by a fixed gain; power supplying means for supplying electric power to the variable gain amplifying means and the fixed gain amplifying means of the above-described amplifying means; electric energy controlling means for controlling electric energy of the electric power supplied from the above-described power supplying means to the above-described fixed gain amplifying means of the above-described amplifying means on the basis of the transmission power control information; and transmitting means for transmitting the above-described transmission information amplified by the above-described amplifying means.

Moreover, the above-described variable gain amplifying means amplifies and outputs the above-described transmission information by a large gain in a case where the above-described transmission power control information instructs large transmission power, and amplifies and outputs the transmission information by a small gain in a case where the above-described transmission power control information instructs small transmission power, and the above-described electric energy controlling means controls the electric energy of the electric power supplied from the above-described power supplying means to the above-described fixed gain amplifying means of the above-described amplifying means may be large in a case where the above-described transmission power control information instructs the large transmission power, and controls the electric energy of the electric power supplied from the above-described power supplying means to the above-described fixed gain amplifying means of the above-described amplifying means may be small in a case where the transmission power control information instructs the small transmission power.

The communication terminal apparatus configured as above performs bypass processing of the electric power supplied from the power supplying means to the fixed gain amplifying means in accordance with the above-described transmission power control information by means of the electric energy controlling means, and consequently the communication terminal apparatus achieves the reduction of the power consumption by controlling the electric energy of the electric power supplied to the fixed gain amplifying means.

Moreover, an amplifying circuit according to the present invention includes amplifying means equipped with at least variable gain amplifying means for amplifying and outputting information by a gain in accordance with gain control information for controlling the gain of amplifying the information, and fixed gain amplifying means for amplifying and outputting the information from the variable gain amplifying means by a fixed gain.

Moreover, the amplifying circuit includes, in addition to this amplifying means, power supplying means for supplying electric power to the variable gain amplifying means and the fixed gain amplifying means of the above-described amplifying means, and electric energy controlling means for controlling electric energy of the electric power supplied from the above-described power supplying means to the above-described fixed gain amplifying means of the above-described amplifying means on the basis of the above-described gain control information.

Moreover, the above-described electric energy controlling means controls the electric energy of the electric power supplied from the above-described power supplying means to the above-described fixed gain amplifying means of the above-described amplifying means may be large in a case where the gain control information instructs a large gain, and controls the electric energy of the electric power supplied from the above-described power supplying means to the above-described fixed gain amplifying means of the above-described amplifying means may be small in a case where the gain control information instructs a small gain.

The amplifying circuit configured as above performs the bypass processing of the electric power supplied from the power supplying means to the fixed gain amplifying means in accordance with the above-described gain control information by means of the electric energy controlling means, and consequently the amplifying circuit achieves the reduction of the power consumption by controlling the electric energy of the electric power supplied to the fixed gain amplifying means.

As described above, the present invention controls the electric energy of the electric power supplied from the power supplying means to the fixed gain amplifying means located at the subsequent stage of the variable gain amplifying means by means of the control information of the gain of the variable gain amplifying means.

Consequently, the electric energy supplied to the fixed gain amplifying means at the time of a low output of the amplifying means can be largely reduced, and significant reduction of the power consumption can be achieved without influencing the characteristic badly.

Hence, the battery of an apparatus to which the present invention is applied can stand long use through the reduction of the power consumption.

BRIEF DESCRIPTION OF THE DRAWINGS

FIG. 4A and FIG. 4B are views each showing a state that reduction in power consumption can be achieved by controlling power energy in the above-described driver amplifier.

FIG. 5 is a circuit diagram of a driver amplifier provided in the mobile telephone of the second embodiment.

BEST MODES FOR IMPLEMENTING THE INVENTION

The present invention can be applied to a mobile telephone supporting a mobile communication system supporting the W-CDMA system.

First Embodiment

[Configuration of Mobile Communication System]

Figure 1:
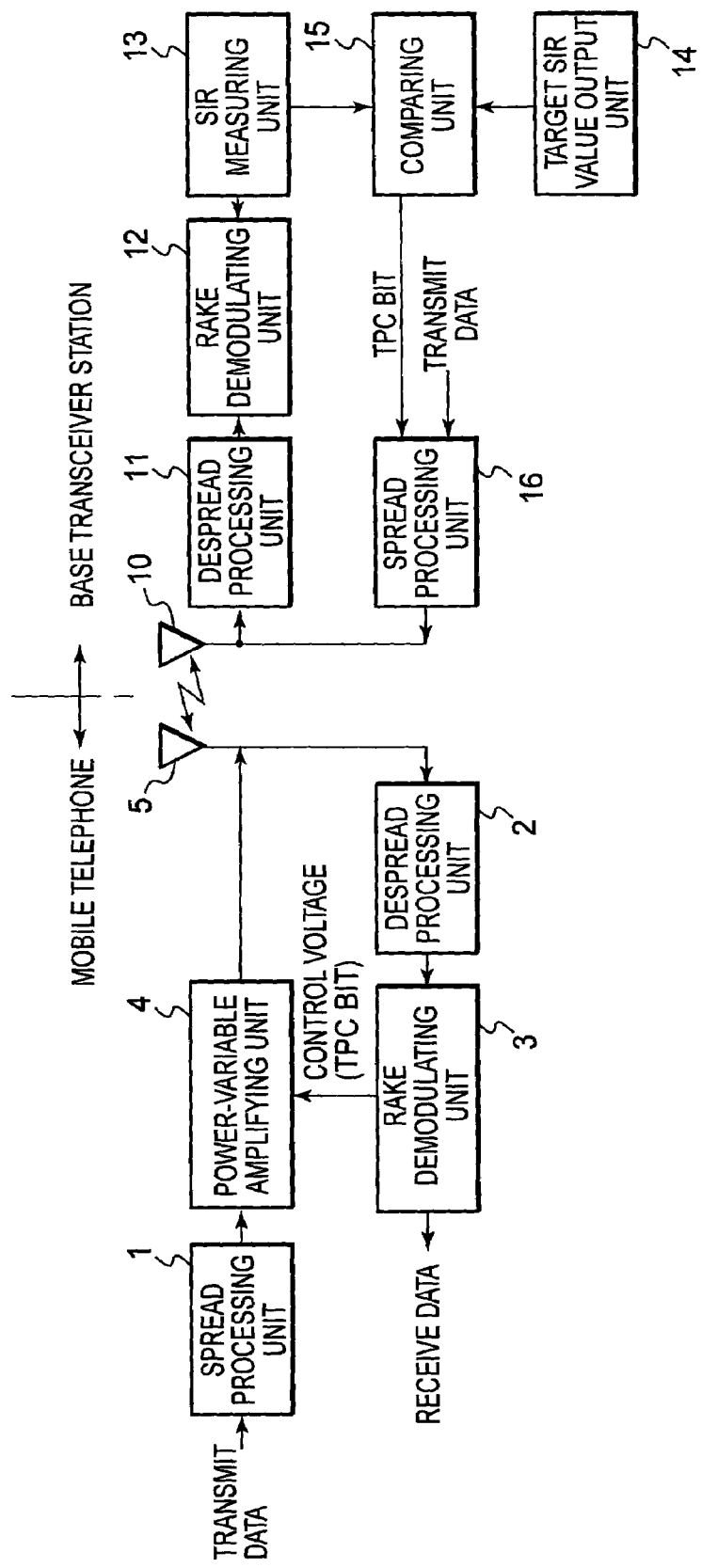
FIG. 1 is a block diagram of a schematic configuration of a main portion of a mobile communication system adaptable for mobile telephones of first to third embodiments to which the present invention is applied.

First, FIG. 1 shows a schematic configuration of a mobile communication system in which a mobile telephone as a first embodiment of the present invention is adapted. Incidentally, the mobile communication system is composed of a mobile telephone, a base transceiver station (BTS), a radio network controller (RNC), multimedia signal processing equipment (MPE) and the like, as the whole. But, in FIG. 1, only the configurations of the mobile telephone and the base transceiver station are shown.

[Configuration of Mobile Telephone]

As shown in FIG. 1, the mobile telephone of the aforementioned embodiment performs predetermined modulation processing such as the BPSK (BPSK: binary phase shift keying) and the HPSK (HPSK: hybrid phase shift keying) to transmit data. The mobile telephone includes a spread processing unit 1 for performing spread processing using a predetermined spread code, and a despread processing unit 2 for performing despread processing to the receive data from the base transceiver station by using a spread code synchronizing with spread code of the receive data.

Moreover, the mobile telephone includes a RAKE demodulating unit 3 for performing RAKE demodulation processing to the receive data from the despread processing unit 2 to outputs the receive data, and for extracting a transmission power control bit (a TPC bit TPC: transmitter power control) added to the receive data to output a control voltage corresponding to the TPC bit.

Moreover, the mobile telephone includes a power-variable amplifying unit 4 for changing a gain on the basis of the control voltage of the above-described TPC bit, and for amplifying the transmit data from the above-described spread processing unit 1 by the changed gain to output the amplified transmit data. Moreover, the mobile telephone includes an antenna 5 for transmitting transmit data from the power-variable amplifying unit 4 to a base transceiver station, and for receiving receive data from the base transceiver station to supply the receive data to the above-described despread processing unit 2.

[Configuration of Base Transceiver Station]

The base transceiver station includes an antenna 10 for performing the transmission and the reception of data to the mobile telephone, a despread processing unit 11 for performing the despread processing of the receive data received from the mobile telephone through the above-described antenna 10, a RAKE demodulating unit 12 for performing the RAKE demodulation processing of the receive data which has processed by the despread processing, and an SIR measuring unit 13 for measuring an SIR value (SIR: signal to interference ratio) on the basis of the receive data which has processed by the RAKE demodulation processing.

Moreover, the base transceiver station includes a target SIR value output unit 14 for outputting a target SIR value (or a reference SIR value), a comparing unit 15 for forming the above-described TPC bit for controlling the transmission power of transmit data transmitted from the mobile telephone on the basis of the difference between the SIR value of the receive data measured by the above-described SIR measuring unit 13 and the target SIR value from the above-described target SIR value output unit 14, and a spread processing unit 16 for performing the spread processing of this TPC bit and transmit data by using a predetermined spread code, and for performing predetermined modulation processing such as the QPSK (QPSK: quadrature phase shift keying) to transmit the processed TPC bit and the transmit data to the mobile telephone through the antenna 10.

[System Operation]

In such a mobile communication system, when the base transceiver station side receives transmit data from the mobile telephone, the base transceiver station performs the despread processing and the RAKE demodulation processing of the receive data in the despread processing unit 11 and the RAKE demodulating unit 12, and measures an SIR value of the receive data in the SIR measuring unit 13. Then, the base transceiver station compares the SIR value of the receive data with a target SIR value in the comparing unit 15, and forms a TPC bit corresponding to the difference of them. The base transceiver station transmits the TPC bit to the mobile telephone together with the transmit data through the spread processing unit 16 and the antenna 10.

When the mobile telephone receives the data from the base transceiver station, the mobile telephone performs the despread processing of the receive data in the despread processing unit 2, and performs the RAKE demodulation processing of the receive data, which has been processed by the despread processing, in the RAKE demodulating unit 3 to extract the above-described TPC bit from the receive data. Then, the mobile telephone forms a control voltage corresponding to the TPC bit in the RAKE demodulating unit 3, and supplies to the control voltage to the power-variable amplifying unit 4.

The power-variable amplifying unit 4 amplifies the transmit data, which has processed by the spread processing in the spread processing unit 1, by the gain changed on the basis of the control voltage supplied from the above-described RAKE demodulating unit 3, and transmits the amplified transmit data to the base transceiver station through the antenna 5.

Thereby, the transmission and the reception of data can be always performed at the most suitable transmission power level according to the distance between the mobile telephone and the base transceiver station (adaptive transmission power control).

[Configuration of Power-Variable Amplifying Unit]

Figure 2:
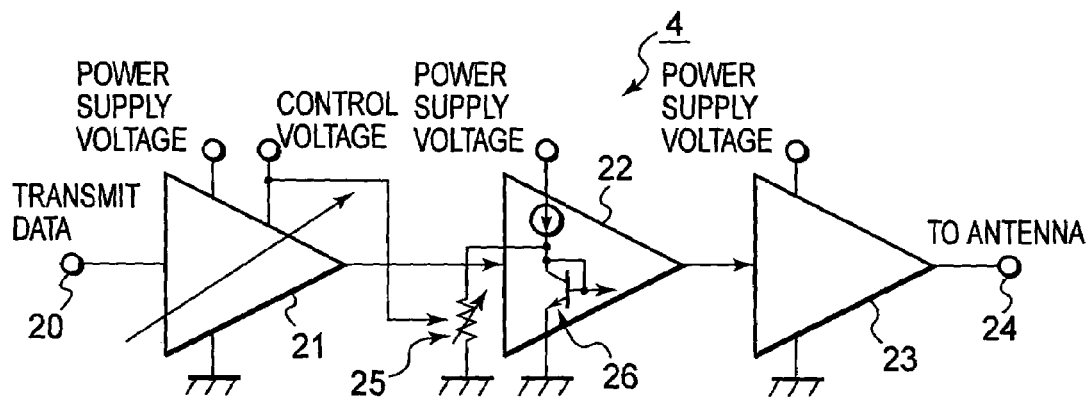
FIG. 2 is a block diagram of a power-variable amplifying unit provided in the mobile telephone of the above-described first embodiment.

Next, FIG. 2 shows a block diagram of the power-variable amplifying unit 4 provided in the above-described mobile telephone for enabling such adaptive transmission power control.

As shown in FIG. 2, the power-variable amplifying unit 4 is an amplifying unit in three-stage configuration composed of a variable gain amplifier 21, a driver amplifier 22 and a power amplifier 23. A bias voltage (power supply voltage) is supplied to each of the amplifiers 21-23 from a power supply control unit, and each of the amplifiers 21-23 is in its driven state during a high level period of a signal for changing the transmission system to be in its driven state (active state) from the control unit (CPU) of the aforementioned mobile communication terminal apparatus.

Moreover, the driver amplifier 22 is designed in order that the overall characteristic of the aforementioned power-variable amplifying unit 4 may satisfy the above-described SIR (signal power to interference power ratio) and the adjacent channel power leakage ratio at the maximum output of the power-variable amplifying unit 4.

The power-variable amplifying unit 4 mentioned above amplifies transmit data supplied from the above-described spread processing unit 1 through an input terminal 20 by the gain changed in accordance with the control voltage corresponding to the above-described TPC bit in the variable gain amplifier 21. Moreover, the power-variable amplifying unit 4 further amplifies the transmit data amplified by the variable gain amplifier 21 in the driver amplifier 22 and the power amplifier 23, each having a fixed gain, and transmits the amplified transmit data to the base transceiver station from an output terminal 24 through the antenna 5.

[Characteristic Configuration of Driver Amplifier]

Now, as described above, the bias voltage (power supply voltage) from the power supply control unit is always applied to each of the amplifiers 21-23, and thereby each of the amplifiers 21-23 is always in its driven state. However, the consumption of the same current quantity at the time of a low output as that at the time of the maximum output would uselessly consume the limited power charged in the battery of the mobile telephone.

Accordingly, a supply power changing circuit is provided in the driver amplifier 22 of the power-variable amplifying unit 4, and the electric energy supplied to the driver amplifier 22 is variably controlled by the supply power changing circuit according to the output level of the aforementioned power-variable amplifying unit 4. Thereby, reducing the power supplied to the driver amplifier 22 results in reduction in useless power consumption.

[Supply Power Changing Circuit]

An example of such a supply power changing circuit is shown in FIG. 2. In a case of this example, the supply power changing circuit is composed of a variable resistor 25 for bypassing the current supplied to a transistor 26 of the driver amplifier 22.

The control voltage supplied to the variable gain amplifier 21 according to the above-described TPC bit is configured to be supplied also to the variable resistor 25, and the resistance value of the variable resistor 25 is variably controlled by the control voltage. Then, the current quantity of the current supplied to the above-described driver amplifier 22 is adjusted correspondingly to the output level of the aforementioned power-variable amplifying unit 4 by bypassing the current of the current quantity according to the resistance value through the variable resistor 25 of the current supplied to the driver amplifier 22, and thereby useless power consumption is reduced.

To put it concretely, in a case where a communication distance between the mobile telephone and the base transceiver station is far, a TPC bit instructing the transmission at a high output is transmitted from the base transceiver station to the mobile telephone. Thereby, a higher control voltage corresponding to the TPC bit instructing the transmission at the above-described high output is applied to the variable gain amplifier 21 and the variable resistor 25 of the driver amplifier 22 from the RAKE demodulating unit 3. Then, the transmit data is amplified by the variable gain amplifier 21 made to have a large gain by the control voltage.

Moreover, the resistance value of the variable resistor 25 of the driver amplifier 22 is controlled to be a large resistance-value by the above-described control voltage. When the resistance value of the variable resistor 25 is controlled to be the large resistance value, a current becomes difficult to flow through the variable resistor 25, and almost all of the current flows through the transistor 26 of the driver amplifier 22 without being limited. Thereby, the driver amplifier 22 amplifies transmit data from the variable gain amplifier 21 by a gain set fixedly as the default, and outputs the amplified transmit data.

On the other hand, in a case where the communication distance between the mobile telephone and the base transceiver station is close, a TPC bit instructing the transmission at a low output is transmitted from the base transceiver station to the mobile telephone. Thereby, a lower control voltage corresponding to the TPC bit instructing the transmission at the above-described low output is applied from the RAKE demodulating unit 3 to the variable gain amplifier 21 and the variable resistor 25 of the driver amplifier 22. Then, the transmit data is amplified by the variable gain amplifier 21 made to have a small gain by the control voltage.

Moreover, the resistance value of the variable resistor 25 of the driver amplifier 22 is controlled to be a small resistance value by the above-described control voltage. When the resistance value of the variable resistor 25 is controlled to be the small resistance value, a current becomes easy to flow through the variable resistor 25, and almost all of the current which is to flow through the transistor 26 of the driver amplifier 22 flows through the side of the variable resistor 25.

Consequently, at the time of being the low output, the current flowing through the driver amplifier 22 uselessly can be suppressed. In this case, the driver amplifier 22 amplifies the transmit data from the variable gain amplifier 21 by a gain corresponding to the thus suppressed current quantity, and outputs the amplified transmit data.

[Detailed Configuration of Driver Amplifier]

Figure 3:
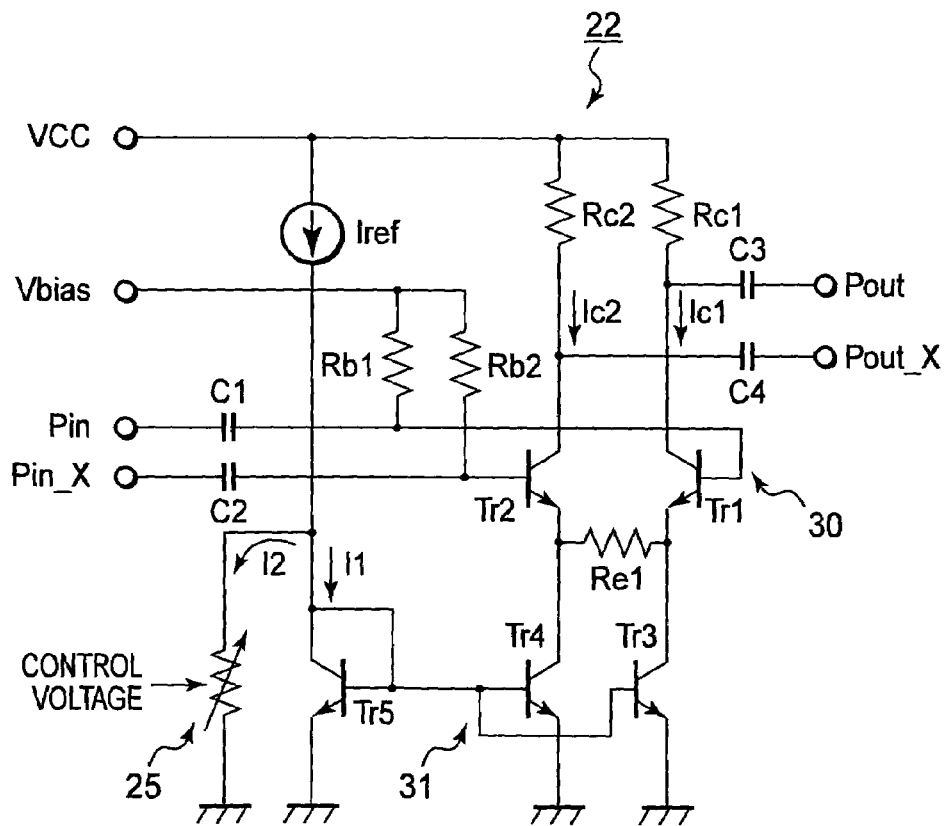
FIG. 3 is a circuit diagram of a driver amplifier provided in the power-variable amplifying unit of the mobile telephone of the above-described first embodiment.

Next, FIG. 3 shows the circuit diagram of the above-described driver amplifier 22. As shown in FIG. 3, the driver amplifier 22 includes a differential amplifier circuit 30 composed of a transistor Tr1 and a transistor Tr2, to which transmit data from the above-described variable gain amplifier 21 is differentially input (Pin, Pin_X), a current mirror circuit 31 formed in a multi-series form composed of a transistor Tr3, a transistor Tr4 and a transistor Tr5, and the above-described variable resistor 25.

(Differential Amplifier Circuit)

Each base of the transistors Tr1 and Tr2 constituting the above-described differential amplifier circuit 30 is connected to the differential input terminals Pin and Pin_X, to which differential input of transmit data is performed, through input coupling capacitors C1 and C2, respectively.

Each of the bases of the transistors Tr1 and Tr2 is connected to a bias input terminal Vbias, to which a bias voltage is supplied, through resistors Rb1 and Rb2 for the bias voltage, respectively.

Collectors of the transistors Tr1 and Tr2 are connected to a constant voltage source VCC through collector resistors Rc1 and Rc2, respectively.

Emitters of the transistors Tr1 and Tr2 are connected to collectors of the transistors Tr3 and Tr4 of the above-described current mirror circuit 31, respectively. Moreover, the emitters of the transistors Tr1 and Tr2 are connected to one end and the other end of an emitter resistor Re1, respectively.

In the differential amplifier circuit 30 configured as above, differential outputs are taken out from a connection point of the collector of the transistor Tr1 and the collector resistor Rc1 and a connection point of the collector of the transistor Tr2 and the collector resistor Rc2 though output coupling capacitors C3 and C4, respectively. The differential outputs are supplied to the above-described power amplifier 23 through differential output terminals Pout and Pout_X.

Incidentally, as the loads of the collectors of the transistors Tr1 and Tr2, alternating-current loads using inductors or capacitors may be used.

Moreover, as the emitter resistor of the transistors Tr1 and Tr2, a reactance component using an inductor or a capacitor may be used.

(Current Mirror Circuit)

Next, in the current mirror circuit 31, a collector of the transistor Tr5 is connected to a constant current source Iref connected to the above-described constant voltage source VCC.

Moreover, the emitter of each of the transistors Tr3-Tr5 is severally earthed, and each of the bases is commonly connected. Then, the common connection point of each of the bases is connected to the connection point of the collector of the above-described transistor Tr5 and the above-described constant current source Iref.

In a case of this example, the ratio of the emitter size of the transistor Tr5 to the emitter sizes of the transistor Tr3 and the transistor Tr4 in the current mirror circuit 31 is set to be 1 to N. Consequently, in a case where the amplification factor of the transistor Tr5 is set to be one, the amplification factors of the transistor Tr3 and the transistor Tr4 are ones of N times of the amplification factor of the transistor Tr5.

Incidentally, relative dispersion of the amplification factors can be improved by providing a resistor having a resistance value inversely proportional to the emitter sizes of the emitters of the transistors Tr3-Tr5 as a resistor for negative feedback.

(Variable Resistor)

The variable resistor 25 is provided in parallel with the transistor Tr5 of the above-described current mirror circuit 31. One end of the variable resistor 25 is earthed, and the other end thereof is connected to the above-described connection point of the transistor Tr5 and the constant current source Iref. Moreover, the variable resistor 25 is connected to the RAKE demodulating unit 3, and the resistance value of the variable resistor 25 is variably controlled according to the control voltage supplied from the RAKE demodulating unit 3, as described above.

[Detailed Operation of Driver Amplifier]

In the driver amplifier 22 as above, in a case where the above-described TPC bit instructs high output data transmission, a high control voltage is applied to the variable resistor 25 from the RAKE demodulating unit 3, the resistance value of the variable resistor 25 is variably controlled to a large resistance value.

The current from the constant current source Iref flows to a side of the transistor Tr5 of the current mirror circuit 31 (I1) and to a side of the variable resistor 25 (I2), respectively. When the resistance value of the variable resistor 25 is controlled to a large resistance value, it becomes difficult for the current to flow through the side of the variable resistor 25, and almost all of the current from the constant current source Iref flows through the side of the transistor Tr5.

Thereby, the current I1 amplified by the transistor Tr5 is supplied to each of the bases of the transistor Tr3 and the transistor Tr4 of the current mirror circuit 31, and then the current flowing through each of the collectors of the transistor Tr3 and the transistor Tr4 increases.

On the other hand, transmit data is differentially input into each of the bases of the transistors Tr1 and Tr2 in the differential amplifier circuit 30 through each of the differential input terminals Pin and Pin_X, respectively. Consequently, each of the transistors Tr1 and Tr2 performs switching operation according to the above-described differentially input transmit data.

When an alternating-current differential input voltage is applied to each of the transistors Tr1 and Tr2 in the differential amplifier circuit 30, currents Ic1 and Ic2, each having an amplitude of almost an N times of the current I1 from the above-described constant current source Iref owing to the amplification of the current I1 by each of the transistors Tr3 and Tr4 in the above-described current mirror circuit 31, respectively, change according to the differential input voltage.

Accordingly, by taking out the current Ic1 from the connection point of the collector of the transistor Tr1 in the differential amplifier circuit 30 and the collector resistor Rc1 through the output coupling capacitor C3, and by taking out the current Ic2 from the connection point of the collector of the transistor Tr2 in the differential amplifier circuit 30 and the collector resistor Rc2 through the output coupling capacitor C4, the transmit data can be taken out from each of the differential output terminals Pout and Pout_X as almost the maximally amplified output of the aforementioned driver amplifier 22. The transmit data is supplied to the power amplifier 23.

Next, in a case where the TPC bit instructs low output data transmission, a low control voltage is applied to the variable resistor 25 from the RAKE demodulating unit 3, the resistance value of the variable resistor 25 is variably controlled to a small resistance value.

In a case where the resistance value of the variable resistor 25 is controlled to the small resistance value, the current becomes easy to flow through the side of the variable resistor 25, and almost all of the current from the constant current source Iref flows through the side of the variable resistor 25 as the current I2. The current I1, the current quantity of which is reduced, is amplified by N times by each of the transistors Tr3-Tr5 in the current mirror circuit 31, and the currents Ic1 and Ic2, each having a magnitude of that of the amplified current I1, flow as bias currents.

Then, transmit data supplied to the differential amplifier circuit 30 is amplified, and is taken out from the above-described differential output terminals Pout and Pout_X.

FIG. 4A shows a characteristic diagram showing a relation between the control voltage supplied to the variable resistor 25 and the gain of the variable gain amplifier 21 provided at the preceding stage of the aforementioned driver amplifier 22, and FIG. 4B shows a characteristic diagram showing a relation between the control voltage supplied to the above-described variable gain amplifier 21 and the variable resistor 25 (or the control voltage for controlling the gain of the variable gain amplifier 21) and the bias current of the driver amplifier 22.

In FIG. 4A, the abscissa axis thereof indicates the control voltage (V) supplied to the variable resistor 25 from the above-described RAKE demodulating unit 3, and the ordinate axis thereof indicates the gain (db) of the variable gain amplifier 21 changed in accordance with the control voltage. As shown in FIG. 4A, the gain of the variable gain amplifier 21 gradually becomes larger as the control voltage applied to the variable gain amplifier 21 is made to be larger.

On the other hand, in FIG. 4B, the abscissa axis thereof indicates the above-described control voltage (V) supplied to the variable resistor 25 from the above-described RAKE demodulating unit 3, and the ordinate axis thereof indicates the bias current value (I) of the driver amplifier 22.

Moreover, in FIG. 4B, a dotted line indicates a characteristic of the conventional driver amplifier configured to consume the same current quantity as that at the time of the maximum output even at the time of a low output, and a solid line indicates the characteristic of the driver amplifier 22 the current quantity of which is controlled according to the output level thereof.

As apparent from FIGS. 4A and 4B, the driver amplifier 22 variably controls the resistance value of the above-described variable resistor 25 according to the control voltage, and variably controls the current quantity of the bias current of the driver amplifier 22. Consequently, the consumption current quantity of the aforementioned driver amplifier 22 can be reduced by a large margin as shown by oblique lines in FIG. 4B in comparison with that of the conventional art.

Effects of First Embodiment

As apparent from the above description, the mobile telephone of the aforementioned first embodiment provides the variable resistor 25 to the driver amplifier 22, and variably controls the resistance value of the variable resistor 25 by means of the control voltage corresponding to the above-described TPC bit. Thereby, the current supplied to the driver amplifier 22 is bypassed, and the current quantity of the current supplied to the driver amplifier 22 is controlled.

Consequently, the current quantity of the current supplied to the driver amplifier 22 at the time of a low output can be largely reduced, and the power consumption of the aforementioned mobile telephone can be largely reduced without influencing the SIR (signal power to interference power ratio) and the adjacent channel power leakage ratio badly.

Consequently, the usable time (including the continuous talking time and the continuous waiting time) of the aforementioned mobile telephone can be elongated through the reduction of the power consumption.

Second Embodiment

Next, a second embodiment of the present invention is described. The above-mentioned first embodiment provides the variable resistor 25 as the supply power changing circuit of the driver amplifier 22, and variably controls the resistance value of the variable resistor 25. Thereby, the first embodiment controls the current quantity of the current flowing through the driver amplifier 22. On the other hand, the second embodiment provides a MOS transistor (MOS: metal oxide semiconductor) as the supply power changing circuit of the driver amplifier 22, and applies the above-described control voltage to the gate of the MOS transistor. Thereby, the second embodiment controls the current quantity of the current flowing through the driver amplifier 22.

FIG. 5 shows a circuit diagram of the driver amplifier 22 in the mobile telephone of the second embodiment. Incidentally, in FIG. 5, the sections operating in the same manners as those of the sections of the driver amplifier 22 described pertaining to the first embodiment are denoted by the same-reference marks as those in FIG. 2, and the duplicating description is omitted.

Configuration of Second Embodiment

In FIG. 5, the driver amplifier 22 includes a MOS transistor 35 as the supply power changing circuit. The MOS transistor 35 includes a source connected to the connection point of each of the transistors Tr3-Tr5 in the current mirror circuit 31 and the constant current source Iref, an earthed drain and a gate connected to the RAKE demodulating unit 3.

Operation of Second Embodiment

To the gate of the MOS transistor 35 as above, the control voltage from the above-described RAKE demodulating unit 3 is input in the state in which the polarity of the control voltage is inverted. The current quantity of the current flowing between the source and the drain is changed according to the voltage value input in the inverted state.

For example, if it is supposed that an n-channel MOS transistor (=NMOS) is provided as the MOS transistor 35, then the current quantity of the current from the above-described constant current source Iref flowing between the source and the drain is controlled according to the voltage value of the above-described control voltage, which is applied to the gate and has a positive polarity.

Moreover, if it is supposed that a p-channel MOS transistor (=PMOS) is provided as the MOS transistor 35, the current quantity of the current from the above-described constant current source Iref flowing between the source and the drain is controlled according to the above-described voltage value of the control voltage, which is applied to the gate and has a negative polarity.

To put it more concretely, in a case where the above-described TPC bit is one indicating large transmission power, a control voltage instructing the large transmission power is supplied to the gate of the MOS transistor 35 in the state in which the polarity of the control voltage is inverted.

Thereby, a small control voltage is supplied to the gate of the MOS transistor 35, and current quantity of the current I1 flowing through the side of the transistor Tr5 in the current mirror circuit 31 increases.

On the other hand, in a case where the above-described TPC bit is one instructing small transmission power, a control voltage instructing the small transmission power is supplied to the gate of the MOS transistor 35 in the state in which the polarity of the control voltage is inverted.

Consequently, a large control voltage is supplied to the gate of the MOS transistor 35, and the current quantity of the current I2 flowing through the MOS transistor 35 side increases in comparison with the current I1 flowing through the side of the transistor Tr5 of the current mirror circuit 31.

Effects of Second Embodiment

As apparent from the above description, the mobile telephone of the aforementioned second embodiment can control the current quantity of the current flowing through the transistor Tr5 in the above-described current mirror circuit 31 by supplying the above-described control voltage to the base of the MOS transistor 35.

Thereby, the same effects as those of the above-mentioned first embodiment can be obtained. Moreover, the supply power changing circuit can be configured in a small scale with only a MOS transistor 35.

Third Embodiment

Next, a third embodiment of the present invention is described. The above-mentioned second embodiment is provided with the MOS transistor 35 as the supply power changing circuit of the driver amplifier 22, and applies the control voltage to the gate of the MOS transistor 35 to control the current quantity of the current flowing through the driver amplifier 22.

However, the MOS transistor has dispersion in characteristic severally. For example, even in a case where the same control voltage of 3 V is applied, a current of 0.5 mA flows through a MOS transistor on one side, and a current of 0.7 mA flows through a MOS transistor on the other side. Consequently, in each driver amplifier 22, difference is produced in the current quantity to be controlled though the control voltage having the same voltage value is applied.

The driver amplifier 22 provided in the mobile telephone of the third embodiment can stably control the current quantity by the above-described control voltage even in a case where the MOS transistor having such characteristic dispersion is used.

Figure 6:
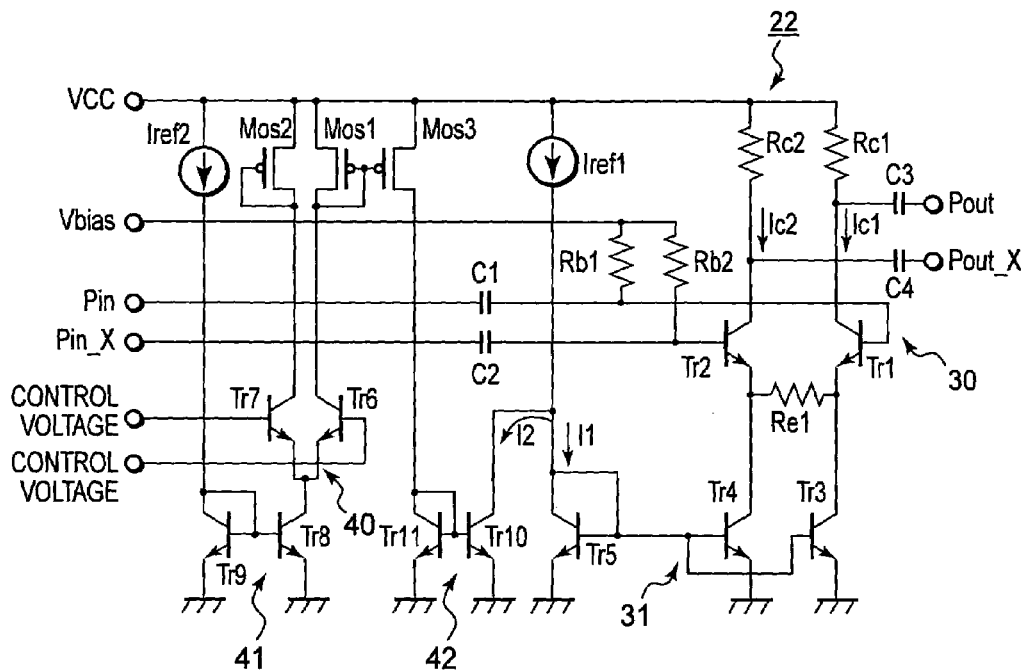
FIG. 6 is a circuit diagram of a driver amplifier provided in the mobile telephone of the third embodiment.
Figure 7:
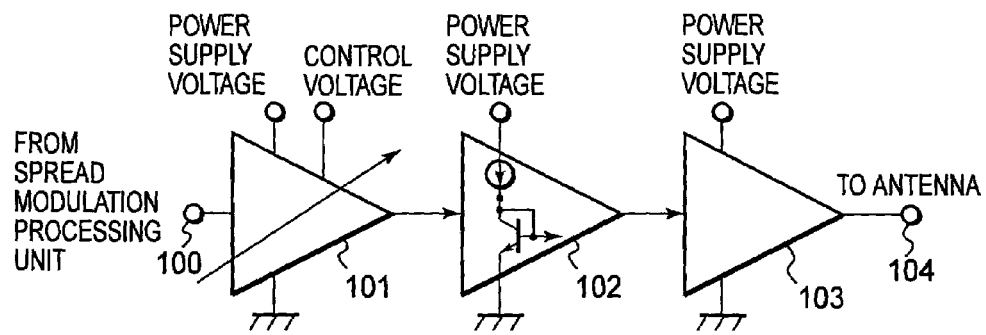
FIG. 7 is a power-variable amplifying unit provided in a conventional mobile communication terminal apparatus performing an adaptive transmission power control.
Figure 8A:
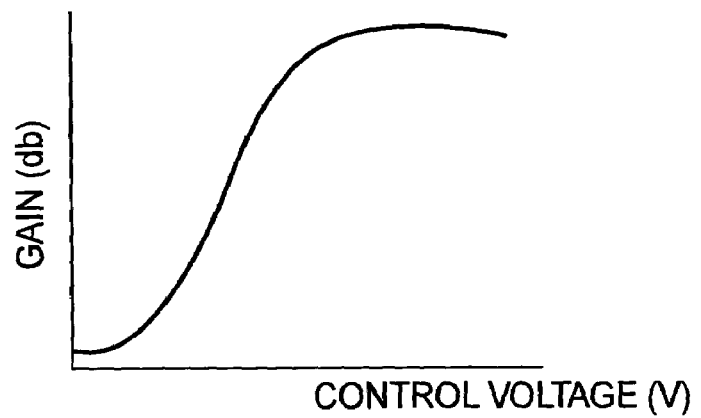
FIG. 8A and FIG. 8B are views for explaining power consumption of a power-variable amplifying unit provided in a conventional mobile communication terminal apparatus.
Figure 8B:
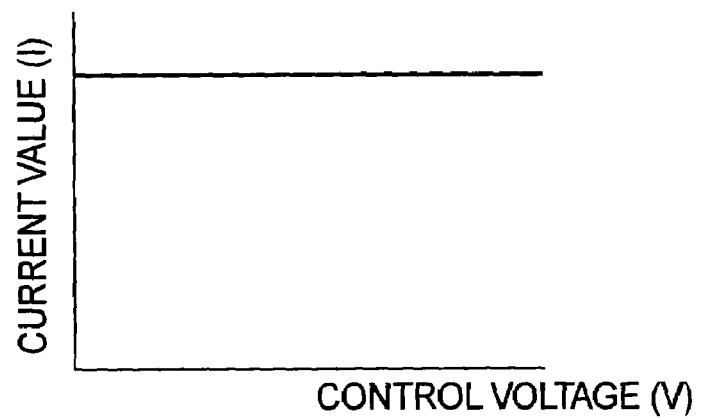

FIG. 6 shows the circuit diagram of the driver amplifier 22 provided in the mobile telephone of the third embodiment. Incidentally, in FIG. 6, the sections operating in the same manners as those of the sections of the driver amplifier 22 described pertaining to the above-mentioned first embodiment are denoted by the same reference marks as those in FIG. 2, and the duplicating description is omitted.

Configuration of Third Embodiment

In FIG. 6, the driver amplifier 22 has a supply power changing circuit composed of a differential voltage-current conversion circuit 40, a first current mirror circuit 41 and a second current mirror circuit 42.

The differential voltage-current conversion circuit 40 is composed of a transistor Tr6 and a transistor Tr7, to the bases of which the control voltages from the above-described RAKE demodulating unit 3 are differentially input. The differential voltage-current conversion circuit 40 includes MOS transistors Mos1 and Mos2, each being an active element, as electronic loads (active dummy loads).

To put it concretely, the source of the MOS transistor Mos1 is connected to the above-described constant voltage source VCC, and the drain of the MOS transistor Mos1 is connected to its own gate and to the collector of the transistor Tr6 in the differential voltage-current conversion circuit 40. Moreover, the gate of the MOS transistor Mos1 is connected to the gate of a MOS transistor Mos3, the source of which is connected to the above-described constant voltage source VCC.

The source of the MOS transistor Mos2 is connected to the above-described constant voltage source VCC, and the drain of the MOS transistor Mos2 is connected to its own gate and to the collector of the transistor Tr7 in the differential voltage-current-conversion circuit 40.

That is to say, each of the MOS transistors Mos1 and Mos2 is an active collector load of the differential voltage-current conversion circuit 40.

Incidentally, this example adopts the configuration (dual control lines) in which the above-described control voltage constituting a differential input is supplied to the base of each of the transistors Tr6 and Tr7 in the differential voltage-current conversion circuit 40. But, in a case where each of the above-described transistors Tr6 and Tr7 is controlled by a single control line, the control voltage is supplied to the transistor Tr6, and a fixed bias voltage may be supplied to the transistor Tr7.

The first current mirror circuit 41 includes a transistor Tr9 and a transistor Tr8, the bases of which are mutually connected. Among them, an emitter of the transistor Tr8 is earthed, and a collector of the transistor Tr8 is connected to the emitter of each of the transistors Tr6 and Tr7 in the above-described differential voltage-current conversion circuit 40.

Moreover, an emitter of the transistor Tr9 in the first current mirror circuit 41 is earthed, and a collector of the transistor Tr9 is connected to the constant current source Iref2. Furthermore, the collector of the transistor Tr9 of the first current mirror circuit 41 is connected to the connection point of each of the bases of the aforementioned transistor Tr9 and the above-described Tr8.

The second current mirror circuit 42 includes a transistor Tr10 and a transistor Tr11, the bases of which are mutually connected. Among them, an emitter of the transistor Tr10 is earthed, and a collector of the transistor Tr10 is connect to a connection point of the transistor Tr5 in the current mirror circuit 31 and the constant current source Iref1.

Moreover, an emitter of the transistor Tr11 in the second current mirror circuit 42 is earthed, and a collector of the transistor Tr11 is connected to its own base and to the drain of the MOS transistor Mos3.

Operation of Third Embodiment

When the control voltages are supplied to the differential voltage-current conversion circuit 40 as a differential input from the above-described RAKE demodulating unit 3, the supply power changing circuit configured as above can obtain the current having a current value corresponding to the voltage values of the control voltages with the first current mirror circuit 41 including the constant current source Iref2 as the drain current of the MOS transistor Mos1.

When the current having the current value corresponding to the voltage values of the above-described control voltages flows as the drain current of the MOS transistor Mos1, each of the transistors Tr10 and Tr11 in the second current mirror circuit 42 is turned on through the MOS transistor Mos3. That is to say, each of the transistors Tr10 and Tr11 in the current mirror circuit 42 is turned on by the current equivalent to the above-described control voltages.

Consequently, the current flowing through the transistor Tr5 in the current mirror circuit 31 is bypassed through the transistor Tr10 in the second current mirror circuit 42. Hence, the current quantity of the current flowing through the aforementioned driver amplifier 22 can be controlled according to the control voltages.

Effects of Third Embodiment

The supply power changing circuit of the driver amplifier 22 provided in the mobile telephone of the third embodiment includes the constant current source Iref2 connected to the constant voltage source VCC, to which the above-described constant current source Iref1 is connected, and the supply power changing circuit performs the on-off control of the differential voltage-current conversion circuit 40 in accordance with the control voltages to obtain the current having the current value corresponding to the control voltages from the constant current source Iref2. Then, the current having the current value corresponding to the control voltages is mirrored by the first and the second current mirror circuits 41 and 42, and the current flowing through the aforementioned driver amplifier 22 is bypassed by the second current mirror circuit 42.

Thereby, because the above-described bypass control can be performed by using the constant current source Iref1 and the constant current source Iref2, both connected to the same constant voltage source VCC, the power consumption of the aforementioned driver amplifier 22 can be accurately controlled even in a case where absolute dispersion is generated in the characteristic of each of the MOS transistors Mos1-

Mos3. Besides, the same effects as those of each of the above-mentioned embodiments can be obtained.

Incidentally, the relative dispersion of the MOS transistors Mos1-Mos3 does not matter because the relative dispersion is secured to a certain degree in a case where the MOS transistors Mos1-Mos3 are formed on the same wafer.

[Other Application Fields]

In the above-mentioned descriptions of the embodiments, the present invention is applied to a mobile telephone of the W-CDMA system. The present invention may be applied to other apparatus, as far as it performs the control of their output levels, such as a mobile telephone of the CDMA system supporting the IS-95 standard, a telephone of PHS (Personal Handyphone System), a PDA (Personal Digital (Data) Assistant) apparatus having a communication function, and a personal computer apparatus. In such cases, effects similar to those described above can be obtained.

Moreover, the power control is performed to the driver amplifier 22, but the power control may be performed to the other amplifiers such as the power amplifier.

Lastly each of the above-mentioned embodiments is an example of the present invention. Consequently, the present invention is not limited to each of the above-mentioned embodiments. It is additionally noted that various changes can be naturally performed according to designing or the like within a sphere of the technical ideas according to the present invention even though the changes differ from each of the embodiments.

INDUSTRIAL APPLICABILITY

The present invention controls electric energy of electric power supplied from power supplying means to fixed gain amplifying means located at a subsequent stage of variable gain amplifying means by means of control information of a gain of the variable gain amplifying means.

Consequently, the electric energy supplied to the fixed gain amplifying means at the time of a low output of amplifying means can be largely reduced, and significant reduction in power consumption can be achieved without influencing the characteristic badly.

Hence, a battery of an apparatus to which the present invention is applied can stand long use through the reduction of the power consumption.

The invention claimed is:

1. A communication terminal apparatus comprising:
an antenna configured to receive transmission power control information for controlling a transmission power of a transmission signal;
a power amplifier including at least a variable gain amplifier configured to amplify and output said transmission signal in accordance with the transmission power control information received by said antenna, and a fixed gain amplifier including a main current mirror circuit and configured to amplify and output the transmission signal from the variable gain amplifier, the main current mirror circuit including a first main current mirror transistor and a second main current mirror transistor, and the second main current mirror transistor is configured to conduct current based on an amount of current conducted by the first main current mirror transistor;
a power supply configured to supply an electric power to the variable gain amplifier and the fixed gain amplifier of said power amplifier, the supplied electric power including a constant supply current;
an electric energy varying unit configured to conduct a first portion of the constant supply current from said power supply to ground and a second portion of the constant supply current to the main current mirror circuit based on the transmission power control information to vary an amount of the electric power provided to the fixed gain amplifier, the electric energy varying unit including
a differential voltage-current conversion circuit having a first differential transistor, a second differential transistor, and a first MOS transistor, a source of the first MOS transistor is connected to the power supply and a drain of the first MOS transistor is connected to a collector of the second differential transistor, a gate of each of the first and second differential transistors is connected to a control signal based on the transmission power control information,
a first current mirror circuit connected to an emitter of each of the first and second differential transistors, and
a second current mirror circuit including a first current mirror transistor, a second current mirror transistors, and a second MOS transistor, a source of the second MOS transistor is connected to the power supply, a gate of the second MOS transistor is connected to a gate of the first MOS transistor, and a drain of the second MOS transistor is connected to a collector of the first current mirror transistor, a gate of the first current mirror transistor, and a gate of the second current mirror transistor, and
the second current mirror transistor is configured to conduct the first portion of the constant supply current from said power supply to ground, the first main current mirror transistor is configured to conduct the second portion of the constant supply current from said power supply to ground, and the second main current mirror transistor is configured to vary the amount of the electric power provided to the fixed gain amplifier based on the second portion of the constant supply current conducted by the first main current mirror transistor; and
a transmitter configured to transmit said transmission signal amplified by said power amplifier.

2. The communication terminal apparatus as described in claim 1, wherein:
said variable gain amplifier amplifies and outputs said transmission signal with a large gain in a case where said transmission power control information instructs large transmission power, and amplifies and outputs the transmission signal with a small gain in a case where said transmission power control information instructs small transmission power; and
said electric energy varying unit varies the electric energy of the electric power supplied from said power supply to said fixed gain amplifier of said power amplifier to be large in a case where said transmission power control information instructs a large transmission power, and varies the electric energy of the electric power supplied from said power supply to said fixed gain amplifier of said power amplifier to be small in a case where the transmission power control information instructs a small transmission power.

3. The communication terminal apparatus as described in claim 1, wherein:
said electric energy varying unit includes a variable resistance connected in parallel to a power supplying line connected from said power supply to said fixed gain amplifier and controlled to have a large resistance value to make the electric energy of the electric power supplied from said power supply to said fixed gain amplifier large in a case where said transmission power control information instructs a large transmission power and to have a small resistance value to make the electric energy of the electric power supplied from said power supply to said fixed gain amplifier small in a case where the transmission power control information instructs a small transmission power.

4. The communication terminal apparatus as described in claim 1, wherein:
said electric energy varying unit includes a MOS transistor having a source and a drain connected in parallel to a power supplying line connected from said power supply to said fixed gain amplifier while a gate of the MOS transistor is provided with said transmission power control information whose polarity is inverted; and
said MOS transistor makes the electric energy of the electric power supplied from said power supply to said fixed gain amplifier large in a case where said transmission power control information instructing a large transmission power is supplied to the gate in a state that the polarity is inverted and makes the electric energy of the electric power supplied from said power supply to said fixed gain amplifier small in a case where said transmission power control information instructing a small transmission power is supplied to the gate in the state that the polarity is inverted.

5. The communication terminal apparatus as described in claim 1, wherein said electric energy varying unit further comprises:
a passing electric energy circuit connected to said power supply, through which the electric power of the electric energy corresponding to said transmission power control information passes;
a first current mirror circuit connected to said power supply and said passing electric energy circuit, and configured to perform a mirroring process so that the electric energy of the electric power from the power supply is equal to or a predetermined number of times of the electric energy of the electric power passing through said passing electric energy circuit;
a MOS transistor provided as an electronic load of said passing electric energy circuit and configured to take out the electric power of the electric energy obtained by the mirroring process in said first current mirror circuit; and
a second current mirror circuit connected in parallel to a power supplying line connected from said power supply to said fixed gain amplifier and configured to perform a mirroring process so that the electric energy of the electric power from the power supply is equal to or a predetermined number of times of the electric energy of the electric power passing through said passing electric energy circuit,
wherein the electric energy of the electric power supplied to said fixed gain amplifier is controlled by performing a bypass process on the electric energy of the electric power corresponding to said transmission power control information supplied to said passing electric energy circuit among the electric power supplied to said fixed gain amplifier from said power supply through said power supplying line.

6. A communication terminal apparatus comprising:
an antenna configured to receive transmission power controlling information for controlling a transmission power of a transmission signal;
a power-variable amplifying unit having at least a variable gain amplifier configured to amplify and output said transmission signal in accordance with the transmission power control information received through said antenna and means for fixed gain amplifying and outputting the transmission signal from the variable gain amplifier, the means for fixed gain amplifying including a main current mirror circuit having a first main current mirror transistor and a second main current mirror transistor, and the second main current mirror transistor is configured to conduct current based on an amount of current conducted by the first main current mirror transistor;
a power supply unit configured to supply electric power to the variable gain amplifier and the means for fixed gain amplifying and outputting, the supplied electric power including a constant supply current; and
means for varying the electric energy of the electric power supplied from said power control unit to said means for fixed gain amplifying by conducting a first portion of the constant supply current from said power supply unit to ground and a second portion of the constant supply current to the main current mirror circuit based on said transmission power control information to vary an amount of the electric power provided to the means for fixed gain amplifying, the means for varying the electric energy further including
a differential voltage-current conversion circuit having a first differential transistor, a second differential transistor, and a first MOS transistor, a source of the first MOS transistor is connected to the power supply and a drain of the first MOS transistor is connected to a collector of the second differential transistor, a gate of each of the first and second differential transistors is connected to a control signal based on the transmission power control information,
a first current mirror circuit connected to an emitter of each of the first and second differential transistors, and
a second current mirror circuit including a first current mirror transistor, a second current mirror transistor, and a second MOS transistor, a source of the second MOS transistor is connected to the power supply, a gate of the second MOS transistor is connected to a gate of the first MOS transistor, and a drain of the second MOS transistor is connected to a collector of the first current mirror transistor, a gate of the first current mirror transistor, and a gate of the second current mirror transistor; and
the second current mirror transistor is configured to conduct the first portion of the constant supply current from said power supply to ground, the first main current mirror transistor is configured to conduct the second portion of the constant supply current from said power supply to ground, and the second main current mirror transistor is configured to vary the amount of the electric power provided to the means for fixed gain amplifying based on the second portion of the constant supply current conducted by the first main current mirror transistor,
wherein said transmission signal amplified by said power-variable amplifying unit is transmitted from said antenna.

7. An amplifier circuit comprising:
a power amplifier having at least a variable gain amplifier configured to amplify and output a signal with a gain corresponding to the control information and a fixed gain amplifier including a main current mirror circuit and configured to amplify and output the signal from the variable gain amplifier with a fixed gain, the main current mirror circuit including a first main current mirror transistor and a second current mirror transistor, and the second main current mirror transistor is configured to conduct current based on an amount of current conducted by the first main current mirror transistor;

a power supply configured to supply an electric power to the variable gain amplifier and the fixed gain amplifier of said power amplifier, the supplied electric power including a constant supply current; and an electric energy varying unit configured to conduct a first portion of the constant supply current from said power supply to ground and a second portion of the constant supply current to the main current mirror circuit based on said control information to vary an amount of the electric power provided to the fixed gain amplifier, the electric energy varying unit including a differential voltage-current conversion circuit having a first differential transistor, a second differential transistor, and a first MOS transistor, a source of the first MOS transistor is connected to the power supply and a drain of the first MOS transistor is connected to a collector of the second differential transistor, a gate of each of the first and second differential transistors is connected to a control signal based on the control information, a first current mirror circuit connected to an emitter of each of the first and second differential transistors, and a second current mirror circuit including a first current mirror transistor, a second current mirror transistor, and a second MOS transistor, a source of the second MOS transistor is connected to the power supply, a gate of the second MOS transistor is connected to a gate of the first MOS transistor, and a drain of the second MOS transistor is connected to a collector of the first current mirror transistor, a gate of the first current mirror transistor, and a gate of the second current mirror transistor, and the second current mirror transistor is configured to conduct the first portion of the constant supply current from said power supply to ground, the first main current mirror transistor is configured to conduct the second portion of the constant supply current form said power supply to ground, and the second main current mirror transistor is configured to vary the amount of the electric power provided to the fixed gain amplifier based on the second portion of the constant supply current conducted by the first main current mirror transistor.

8. The amplifier circuit as described in claim 7, wherein:
said electric energy varying unit is further configured to control the electric energy of the electric power supplied from said power supply to said fixed gain amplifier of said power amplifier to be large in a case where said gain control information instructs a large gain and controls the electric energy of the electric power supplied from said power supply to said fixed gain amplifier of said power amplifier to be small in a case where said gain control information instructs a small gain.

9. The amplifier circuit as described in claim 7, wherein:
said electric energy controlling unit includes a variable resistance connected in parallel to a power supplying line connected from said power supply to said fixed gain amplifier and controlled to have a large resistance value to make the electric energy of the electric power supplied from said power supply to said fixed gain amplifier large in a case where said gain control information instructs a large gain and to have a small resistance value to make the electric energy of the electric power supplied from said power supply to said fixed gain amplifier small in a case where said gain control information instructs a small gain.

10. The amplifier circuit as described in claim 7, wherein:
said electric energy controlling unit includes a MOS transistor having a source and a drain connected in parallel to a power supplying line connected from said power supply to said fixed gain amplifier while a gate is provided with said gain control information whose polarity is inverted; and said MOS transistor makes the electric energy of the electric power supplied from said power supply to said fixed gain amplifier large in a case where said gain control information instructing a large gain is supplied to the gate in a state that the polarity is inverted and makes the electric energy of the electric power supplied from said power supply to said fixed gain amplifier small in a case where said gain control information instructing a small gain is supplied to the gate in a state that the polarity is inverted.

11. The amplifier circuit as described in claim 7, wherein said electric energy controlling unit further comprises:
a passing electric energy circuit connected to said power supply, through which the electric power of the electric energy corresponding to said gain control information passes;

a first current mirror circuit connected to said power supply and said passing electric energy circuit, and configured to perform a mirroring process so that the electric energy of the electric power from the power supply is equal to or a predetermined number of times of the electric energy of the electric power passing through said passing electric energy circuit;

a MOS transistor provided as an electronic load of said passing electric energy circuit and configured to take out the electric power of the electric energy obtained by the mirroring process in said first current mirror circuit; and a second current mirror circuit connected in parallel to a power supplying line connected from said power supply to said fixed gain amplifier and configured to perform a mirroring process so that the electric energy of the electric power from the power supply is equal to or a predetermined number of times of the electric energy of the electric power passing through said passing electric energy circuit, wherein the electric energy of the electric power supplied to said fixed gain amplifier is controlled by performing a bypass process on the electric energy of the electric power corresponding to said gain control information supplied to said passing electric energy circuit among the electric power supplied to said fixed gain amplifier from said power supply through said power supplying line.

12. An amplifier circuit comprising:
a power-variable amplifying unit having at least a variable gain amplifier configured to amplify and output a signal in accordance with the control information and means for fixed gain amplifying and outputting the signal from the variable gain amplifier with a fixed gain, the means for fixed gain amplifying including a main current mirror circuit having a first main current mirror transistor and a second main current mirror transistor, and the second main current mirror transistor is configured to conduct current based on an amount of current conducted by the first main current mirror transistor;

a power supply unit configured to supply electric power to the variable gain amplifier and the means for fixed gain amplifying and outputting, the supplied electric power including a constant supply current; and means for varying the electric energy of the electric power supplied from said power control unit to said means for fixed gain amplifying by conducting a first portion of the constant supply current from said power supply unit to ground and a second portion of the constant supply current to the main current mirror circuit based on said control information to vary an amount of the electric power provided to the means for fixed gain amplifying, the means for varying the electric energy including a differential voltage-current conversion circuit having a first differential transistor, a second differential transistor, and a first MOS transistor, a source of the first MOS transistor is connected to the power supply and a drain of the first MOS transistor is connected to a collector of the second differential transistor, a gate of each of the first and second differential transistors is connected to a control signal based on the control information, a first current mirror circuit connected to an emitter of each of the first and second differential transistors, and a second current mirror circuit including a first current mirror transistor, a second current mirror transistor, and a second MOS transistor, a source of the second MOS transistor is connected to the power supply, a gate of the second MOS transistor is connected to a gate of the first MOS transistor, and a drain of the second MOS transistor is connected to a collector of the first current mirror transistor, a gate of the first current mirror transistor, and a gate of the second current mirror transistor, and the second current mirror transistor is configured to conduct the first portion of the constant supply current from said power supply to ground, the first main current mirror transistor is configured to conduct the second portion of the constant supply current from said power supply to ground, and the second main current mirror transistor is configured to vary the amount of the electric power provided to the means for fixed gain amplifying based on the second portion of the constant supply current conducted by the first main current mirror transistor.

13. A communication terminal apparatus comprising:

an antenna configured to receive transmission power control information for controlling a transmission power of a transmission signal;

a power amplifier including at least a variable gain amplifier configured to amplify and output said transmission signal in accordance with the transmission power control information received by said antenna, a first fixed gain amplifier including a main current mirror circuit and configured to amplify and output the transmission signal from the variable gain amplifier by a first fixed gain, and a second fixed gain amplifier configured to amplify and output the transmission signal from the first fixed gain amplifier by a second fixed gain, the main current mirror circuit including a first main current mirror transistor and a second main current mirror transistor, and the second main current mirror transistor is configured to conduct current based on an amount of current conducted by the first main current mirror transistor;

a power supply configured to supply an electric power to the variable gain amplifier, the first fixed gain amplifier, and the second fixed gain amplifier of said power amplifier, the supplied electric power including a constant supply current;

an electric energy varying unit configured to conduct a first portion of the constant supply current supplied from said power supply to ground and a second portion of the constant supply current to the main current mirror circuit based on the transmission power control information to vary an amount of the electric power provided to the first fixed gain amplifier, the electric energy varying unit including a differential voltage-current conversion circuit having a first differential transistor, a second differential transistor, and a first MOS transistor, a source of the first MOS transistor is connected to the power supply and a drain of the first MOS transistor is connected to a collector of the second differential transistor, a gate of each of the first and second differential transistors is connected to a control signal based on the transmission power control information, a first current mirror circuit connected to an emitter of each of the first and second differential transistors, and a second current mirror circuit including a first current mirror transistor, a second current mirror transistor, and a second MOS transistor, a source of the second MOS transistor is connected to the power supply, a gate of the second MOS transistor is connected to a gate of the first MOS transistor, and a drain of the second MOS transistor is connected to a collector of the first current mirror transistor, a gate of the first current mirror transistor, and a gate of the second current mirror transistor, and the second current mirror transistor is configured to conduct the first portion of the constant supply current from said power supply to ground, the first main current mirror transistor is configured to conduct the second portion of the constant supply current from said power supply to ground, and the second main current mirror transistor is configured to vary the amount of the electric power provided to the first fixed gain amplifier based on the second portion of the constant supply current conducted by the first main current mirror transistor; and a transmitter configured to transmit said transmission signal amplified by said power amplifier.

14. The apparatus of claim 1, wherein an increase in the portion of the electric power conducted to ground by the electric energy varying unit corresponds to a decrease in electric power consumed by the fixed gain amplifier.

15. The apparatus of claim 6, wherein an increase in the portion of the electric power conducted to ground by the means for varying the electric energy corresponds to a decrease in electric power consumed by the fixed gain amplifier.

16. The amplifier circuit of claim 7, wherein an increase in the portion of the electric power conducted to ground by the electric energy varying unit corresponds to a decrease in electric power consumed by the fixed gain amplifier.

17. The amplifier circuit of claim 12, wherein an increase in the portion of the electric power conducted to ground by the means for varying the electric energy corresponds to a decrease in electric power consumed by the fixed gain amplifier.

18. The apparatus of claim 13, wherein an increase in the portion of the electric power conducted to ground by the electric energy varying unit corresponds to a decrease in electric power consumed by the first fixed gain amplifier.

* * * * *